United States Patent [19]
Collins et al.

[11] 3,792,465
[45] Feb. 12, 1974

[54] CHARGE TRANSFER SOLID STATE DISPLAY

[75] Inventors: Dean R. Collins, Dallas, Tex.; David L. Carter, Upper Montclair, N.J.

[73] Assignee: Texas Instruments Incorporated, Dallas, Tex.

[22] Filed: Dec. 30, 1971

[21] Appl. No.: 214,367

[52] U.S. Cl. ...... 340/324 R, 317/235 R, 340/168 S, 340/173 LS

[51] Int. Cl. ............ H01l 17/00

[58] Field of Search 317/235.27, DIG. 4; 340/324 R, 340/168 S, 173, 173 LS; 178/7.1

[56] References Cited

UNITED STATES PATENTS

| | | | |
|---|---|---|---|
| 3,660,697 | 5/1972 | Berglund et al. | 317/235 |
| 3,676,715 | 7/1972 | Brojdo | 317/235 N |
| 3,623,026 | 11/1971 | Engeler et al. | 317/235 N |
| 3,521,244 | 7/1970 | Weimer | 340/173 |
| 3,400,273 | 9/1968 | Horton | 178/7.1 |
| 3,225,342 | 12/1965 | Clark | 340/168 S |

*Primary Examiner*—John W. Caldwell
*Assistant Examiner*—Marshall M. Curtis
*Attorney, Agent, or Firm*—James O. Dixon

[57] ABSTRACT

A solid state display includes a semiconductor charge shift register. The semiconductor substrate is formed to define a p-n junction in a plane parallel to the display surface. Information to be displayed is read into respective bits of the shift register in the form of minority carriers. The p-n junction is reversed biased to near avalanche. The minority carriers are transferred from the potential wells towards the p-n junction, triggering the avalanche, providing increased light output. In one aspect of the invention, a hetero-junction structure is provided for the substrate where silicon is used as the semiconductor charge shift register material and a semiconductor having good light emitting characteristics, such as a direct energy gap semiconductor material, is used to effect the display.

14 Claims, 4 Drawing Figures

CHARGE TRANSFER SOLID STATE DISPLAY

This invention pertains to solid state displays in general and more particularly to an improved semiconductor charge shift register solid state display.

Numerous advantages may be realized in utilizing semiconductor charge devices for various applications due to their relative simplicity, low cost, and fabrication ease.

These devices are metal-insulator-semiconductor structures which store and transfer information in the form of electrical charge. The charge-coupled devices are distinguished by the property that the semiconductor portion of the device is, for the most part, homogeneously doped, impurity diffusions being required only for injecting or extracting charge. Another type of semiconductor charge devices are generally referred to as "bucket-brigade" configured insulated gate field effect transistors.

With respect to the charge coupled device, a shift register configuration generally includes three or more sets of metal electrodes formed on the insulator-semiconductor structure. A DC bias sufficient to invert the semiconductor surface is applied between the electrodes and the semiconductor and clocking pulses are applied to the electrodes. The clocking pulses are effective to invert the semiconductor surface such that the minority carriers are drawn to the semiconductor-insulator interface and tend to collect there in "potential wells" under the metal electrodes. When the clocking pulses are sufficiently large, the minority carriers will transfer from the area under one electrode to the area under the next following the potential wells produced by the clocking pulses.

It has been proposed by Boyle et al. Bell Systems Technical Journal 49, Page 58 (1970) that charge-coupled devices could be used as a display by reading information in the form of minority carriers into the device via shift register action, then forward biasing the structure to force the minority carriers into the bulk where recombination takes place producing visible emission.

Some major problems are associated with utilizing semiconductor charge devices in a solid state display. One consideration is related to the fact that silicon is the preferred semiconductor charge material. Silicon, however, has very low efficiency as a display material since it does not have a direct energy band gap and hence, the quantum efficiency is very low. Another major problem associated with using semiconductor charge devices pertains to the power (light) emitted from such a display. Consider, for example, that the light output expressed in power per square centimeter is defined by the expression $N(\gamma h\nu)f$ where $N$ is the number of charges under an electrode per square centimeter, $\gamma$is the quantum efficiency, $h$ is planck's constant, $c/\nu$ is the wave length of emitted radiation, and $f$ is the frequency of emission per second, that is, the number of times charge is "dumped" per second. Assuming some near optimum conditions and letting $f = 10^6$ and $\gamma = 1$, $N = Q/q$ where $Q = CV$. Assume that the dielectric constant is approximately $4 \times \epsilon_o$. Utilizing the values for silicon and silicon oxide, then $C = 3.5 \times 10^{-8} F/\text{cm}^2$; the voltage is approximately 10 volts for 1,000 A of insulation. For this situation the power per square centimeter $= N(h\gamma)\nu f = 8.7 \times 10^{116\ 3}$ watts/cm$^2$.

Conventional light emitting diodes in the visible range, however, have an output on the order of 0.6 watts per square centimeter. Thus, it may be seen that for a typical semiconductor charge transfer device solid state display the output level is on the order of 100 times less than a useful light output level. This restriction is not limited to silicon, but is a general property of not having enough charge in a potential well.

Accordingly an object of the invention is the provision of a semiconductor charge solid state display having acceptable power output levels.

A further object of the invention is a solid state display including a semiconductor material substrate having good visible light emitting characteristics and having a reversed biased p-n junction extending through the substrate in a plane substantiaoly parallel to the display surface.

A further object of the invention is a hetero-junction substrate with silicon as the semiconductor charge material, and a material exhibiting good light emitting characteristics as the display material.

Briefly in accordance with the present invention, an improved semiconductor charge solid state display is provided. Information for display is read into the semiconductor charge devices by shift register action in the form of minority carriers. A semiconductor substrate having major surfaces on opposite sides is utilized, and a p-n junction is defined in the substrate in a plane which is parallel to the major surfaces of the substrate. In one embodiment the substrate comprises a unitary body of semiconductor material having good light emitting characteristics. Means are provided for reverse biasing the p-n junction to near avalanche breakdown such that the minority carriers corresponding to the data to be displayed trigger avalanche and provide a large quantity of minority carriers effective for producing a visible display upon recombination with majority carriers. As used herein the term avalanche will be taken to mean that state of reverse bias just short of complete avalanche breakdown, wherein controlled multiplication of charge takes place. This multiplication region is described in "Physics and Technology of Semiconductor Devices" by A.S. Grove, John Wiley & Sons, 1967, at pages 191 to 194. It describes a range of reverse bias for which the resultant electric field in the depletion region is strong enough to impart sufficient velocity to minority carriers to enable them to free additional minority carriers upon collision with the lattice atoms. This process of ionization is the same as that involved in complete avalanche breakdown, but as contemplated herein, the electric fields are not strong enough to lead to a self-sustaining process. Thus, for any given external reverse bias within the multiplication region the ratio between the number of minority carriers initially introduced into the depletion region and the number of minority carriers ultimately available for recombination as a result of the multiplication phenomena, is a finite constant. a particular aspect of the invention, the substrate comprises gallium aresenide phosphide. In a different embodiment of the invention, the solid state display includes a semiconductor substrate which has a hetero junction. The substrate includes a first body of silicon of one conductivity type and a second contiguous body of semiconductor material of opposite conductivity type and which exhibits good light emitting characteristics. The p-n junction between these two materials is formed in a plane of the substrate substantially parallel to the display surface. The silicon body is utilized in conjunction with the semiconductor charge device to provide good charge transfer efficiency and the other material is utilized to effect the visible display.

The invention also includes a method for displaying light utilizing a semiconductor charge solid state display which includes a semiconductor substrate having a p-n junction therein which is substantially parallel to the display surface of the substrate. A semiconductor charge shift register is defined in the surface of the substrate opposite the display surface. The method includes shifting minority carriers corresponding to the desired image into respective bits of the shift register, and reverse biasing the p-n junction to near avalanche breakdown. The semiconductor charge device electrode potentials are then adjusted such that minority carriers are swept into the bulk of the substrate and effect emission of light upon recombining with majority carriers.

Other objects, advantages and novel features of the invention will be apparent upon reading the following detailed description of illustrative embodiments in conjunction with the drawings wherein.

Figure 1:
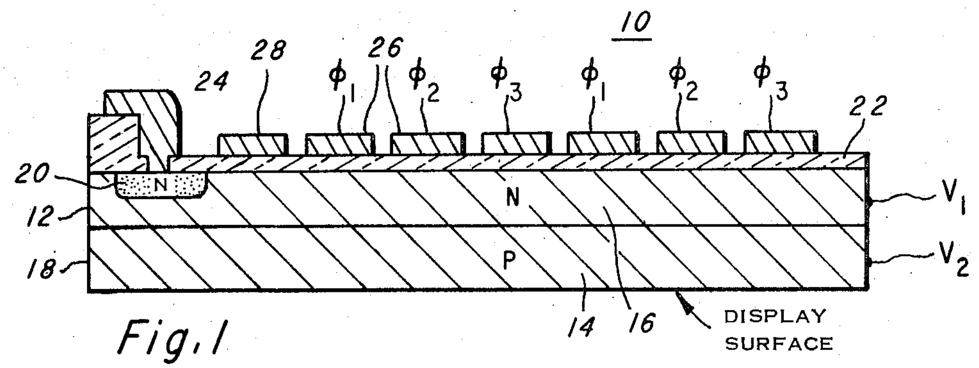
FIG. 1 is a cross section illustrating a charge-coupled device embodiment of the present invention.

With reference to FIG. 1, a solid state display in accordance with an illustrative embodiment of the invention is illustrated generally at 10. A semiconductor substrate 12 includes a first region 14 of one conductivity type and a second region 16 of opposite conductivity type. The substrate 12 comprises a semiconductor material of good light emitting charactertistics. By way of example, the substrate 12 may comprise gallium arsenide phosphide, gallium phosphide, gallium nitride or gallium-aluminum-arsenide. The regions of opposite conductivity type 14 and 16 may be formed by a variety of techniques well known to those skilled in the art. For example, the regions may be formed by epitaxial deposition techniques, diffusion techniques, or ion implantation. The regions 14 and 16 form a p-n junction 18. A pocket 20 of conductivity type opposite to that of the region 16 is formed to extend from the exposed surface of the region 16. As will be explained in greater detail hereinafter, this pocket 20 is utilized to read data into the semiconductor charge shift register. A relatively thin insulating layer 22 is formed to overlie the substrate 12. The insulating layer 22 defines an aperture 24 which exposes a surface region of the pocket 20. Ohmic contact is made through the aperture 24. A plurality of elongated substantially parallel electrodes 26 are defined on the surface of the insulating layer 22. In the present illustrative example, a single level, three-phase charge-coupled device shift register is illustrated. Each set of three electrodes defines one bit of the shift register and correspondingly, one resolution element of the display. Multiphase clocks are sequentially applied to the three electrodes to effect propagation of electrical charge. A transfer electrode 28 may be utilized to control transfer of information in the form of minority carriers from the pocket 20 to the potential wells under the electrodes 26. Multiphase clocks which may be utilized are well known to those skilled in the art and need not be identified in greater detail herein. Means for reverse biasing the p-n junction 18 are illustrated generally by connections $V_1$ and $V_2$, respectively to the regions 14 and 16. In accordance with the invention, reverse biasing the p-n junction 18 to near avalance breakdown enables a substantial increase in the number of available minority charge carriers and thus enables a visible output of increased power level.

In operation, the information desired to be displayed is read into the shift register through the input p-n junction region 20 and shifted down the register by the clock pulses. The p-n junction 18 is reverse biased to near avalanche breakdown. When the invormation is in the desired location, the electrode potentials are reversed such that the change in the potential wells under the respective bits of the shift register are "dumped" into the bulk of the substrate away from the semiconductor insulator interface, triggering an avalanche or multiplication of carriers when the charge reaches the p-n junction. These minority carriers recombine with majority carriers in the region 14 and thereby emit radiation. By avalanching the junction, an increase in the number of charge carriers available is produced on the order of 100 or more. This is effective to raise the power level to a useful level for a display.

Figure 2:
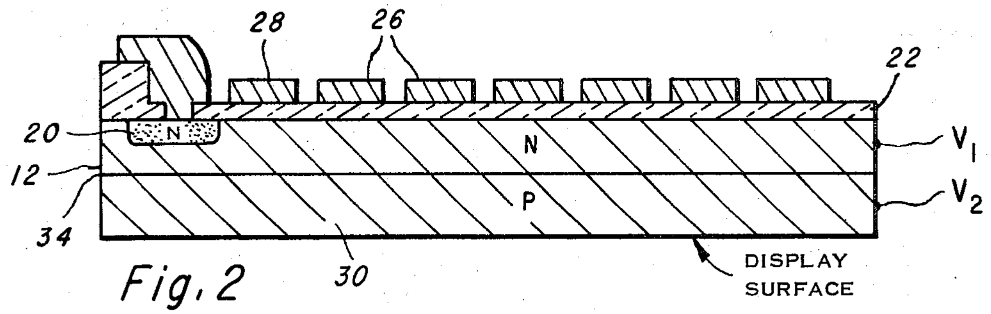
FIG. 2 is a cross sectional view of an embodiment of the invention utilizing a hetero junction.

With reference to FIG. 2, there is illustrated an embodiment of the invention wherein a hetero-junction is utilized. For this situation the substrate 12 includes a layer 30 of one conductivity type semiconductor material which has good light emitting characteristics. This layer, for example, comprises a material having good light emitting characteristics such as gallium-arsenide-phosphide, gallium phosphide, gallium-aluminum-arsenide or gallium nitride. A layer 32 of silicon is formed contiguous to layer 30 and is of opposite conductivity type therefrom. The two layers define a hetero p-n junction 34. Again, a single level metallization, three-phase semiconductor charge-coupled device shift register is illustrated with a p-n junction region 20 for entering input information and a transfer electrode 28 for transferring data into the shift register. Means (illustrated generally at $V_1$ and $V_2$) are provided for reverse biasing the p-n junction 34. In this situation the insulating layer 22 may advantageously be silicon oxide formed to a thickness on the order of 1,000 A. Other insulating materials, of course, could be utilized. Operation of the display illustrated in FIG. 2 is similar to that described above with reference to FIG. 1. For this embodiment, however, the advantages of utilizing silicon for the semiconductor charge device are realized and also the advantages of using a semiconductor material having good light emitting characteristics are also included. Techniques for forming hetero junctions are known to those skilled in the art.

While FIG. 1 and FIG. 2 have illustrated a single level, three-phase charge-coupled device shift register, it is to be appreciated that multilevel metallization techniques, such as described in co-pending application, Ser. No. 130,358 entitled "Semiconductor Device and Method of Fabrication" by Dean R. Collins, et al., filed Apr. 1, 1971, may be utilized. Also, multi-phase shift registers other than 3-phase systems may advantageously be utilized if desired.

Figure 3:
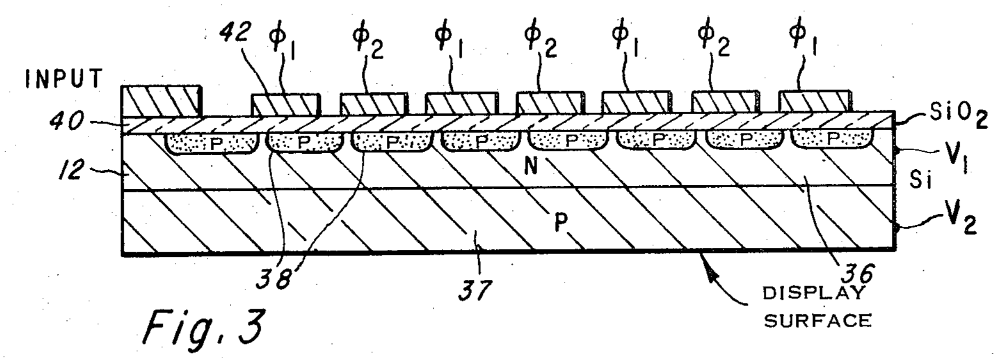
FIG. 3 is a cross section view illustrating a bucket-brigade insulated gate field effect transistor configuration of a semiconductor charge solid state display.

With reference to FIG. 3 there is illustrated in cross section, a bucket-brigade configuration of insulated gate field-effect transistors which may be utilized as a semiconductor charge shift register. This type of semiconductor charge device may be utilized in both of the embodiments illustrated in FIGS. 1 and 2. The bucket-brigade configuration requires a two-phase clocking system connected to successive gate electrodes of the transistors for propagating data along the shift register. The semiconductor substrate 12 may for example, include a layer of silicon of one conductivity type (illustrated generally at 36), and a layer of material having good light emitting characteristics of opposite conductivity type, such as GaAsP, at 37. Regions of opposite conductivity type are formed by conventional techniques at 38 and form source and drain regions of the insulated gate field-effect transistors. A relatively thin insulating layer 40 of, for example, silicon oxide, silicon nitride or other insulating material may be formed to a thickness of approximately 1,000 A. Conductive gate electrodes 42 are formed over the insulating layer 40. In the bucket-brigade configuration, the gate electrode typically extends over a greater portion of the diffused regions 38 of the transistor to enhance Miller capacitance and to facilitate storage of electrical charge. As understood by those skilled in the art, typically data is stored in only every other bucket of the brigade.

Figure 4:
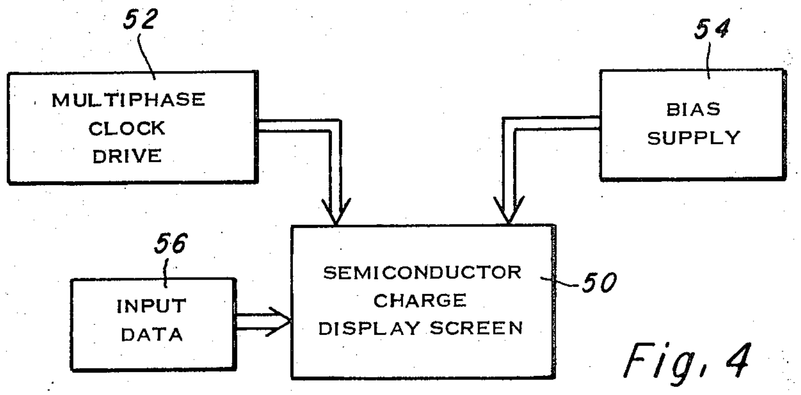
FIG. 4 is a block diagram illustration of a display system in accordance with the present invention.

With reference to FIG. 4, there is illustrated in block diagram format a solid state display system in accordance with the invention. The solid state display comprises a semiconductor charge display screen (referenced generally at 50). This display screen, may for example, comprise any of the structures illustrated in FIGS. 1 – 3. A multi-phase clock drive 52 is operably connected to the display screen 50. A DC bias supply is illustrated generally at 54. This bias supply is effective to reverse bias the p-n junction in the substrate to near avalanche breakdown to enable a multiplication of the minority charge carriers to effect a display of suitable power capability. In operation of the display screen, a voltage of approximately −10 volts applied to the electrodes 26 is effective to invert the silicon and form a potential well therein. The desired information for display shown in block diagram at 56 is then clocked in by the clock drive 52. The p-n junction is reversed biased to near avalanche or multiplication. A voltage on the order of about 40 volts is effective for this purpose. The electrodes are then raised to a positive voltage of, by way of example, plus 10 volts, "dumping" the minority carriers into the bulk of the substrate. The minority carriers diffuse or drift toward the p-n junction and are swept across the junction and multiplied by the avalanched junction. Upon recombining with majority carriers, a visible display is effected.

While the present invention has been described in detail with respect to several illustrative embodiments, it will be apparent to those skilled in the art that various modifications and changes may be made without departing from the scope of spirit of the invention. In this respect, it will be appreciated that either p or n-type substrates may be used for the semiconductor charge devices.

What is claimed is:

1. In a semiconductor charge transfer device solid state display wherein information in the form of minority carriers is read in via shift register action and the metal-insulator-semiconductor structure is biased to effect light emission by recombination, the improvement comprising a semiconcuctor substrate having major surfaces on opposite sides, a continuous p-n junction defined in said substrate in a plane parallel to said major surfaces, said substrate comprising a semiconductor material having good light emitting characteristics, and bias means operably connected to said structure for avalanching said juntion thereby substantially increasing the amount of light emitted by said display.

2. A semiconductor charge display as set forth in claim 1 wherein said substrate comprises gallium-arsenide phosphide.

3. A semiconductor charge solid state display as set forth in claim 1 wherein said substrate is selected from the group consisting of gallium nitride, gallium phosphide, and gallium-aluminum-arsenide.

4. A solid state display comprising:

a. a semiconductor substrate having major surfaces on opposite sides. Semiconductor material adjacent, one surface being of one conductivity type and semiconductor material adjacent the other surface of opposite conductivity type defining a continuous p-n junction in said substrate which lies in a plane substantially parallel to said surfaces, b. means for reverse biasing said p-n junction to near avalanche breakdown, c. a pocket of said opposite conductivity type material extending from said one surface and combined within material of said one conductivity type, d. a relatively thin insulating layer over said one surface and pocket of opposite conductivity type defining an aperture therethru exposing a surface region of said pocket, e. ohmic contact means extending through said aperture and contacting said pocket for entering data in the form of minority carriers, f. a plurality of elongated substantially parallel electrodes over said insulating layer spaced from said aperture to define a charge coupled device shift register, g. clocking means of one polarity operably connected to said electrodes for sequentially shifting said data into respective bits of such shift register, and h. bias means connected to said electrodes for applying a bias of polarity opposite said one polarity effective to force electrical charge stored in said bits away from said electrodes and toward said p-n junction, thereby avalanching or multiplying the minority carriers in the depletion region of said junction.

5. A display system as set forth in claim 4 wherein said substate comprises gallium arsenide phosphide.

6. A display system as set forth in claim 4 wherein said substrate is selected from the group consisting of gallium arsenide phosphide, gallium phosphide, gallium-aluminum-arsenide, and gallium nitride.

7. In a semiconductor charge transfer device solid state display wherein information in the form of minority carriers is read in via shift register action and the metal-insulator-semiconductor structure is biased to force minority carriers into the bulk of said semiconductor to effect light emission by recombination, the improvement comprising a semiconductor substrate having major surfaces on opposite sides, said substrate comprising a first body of silicon of one conductivity type and a second contiguous body of a semiconductor material of opposite conductivity type and which exhibits good light - emitting characteristics, defining a continuous hetero p-n junction in a plane of said substrate substantially parallel to said major surfaces, said silicon body disposed for effecting said semiconductor charge shift register; and means for reverse biasing said junction to near avalanche breakdown, thereby avalanching the minority carriers in the depletion region of said p-n junction.

8. A display system as set forth in claim 7 wherein said second body comprises a direct energy gap semiconductor material.

9. A display system as set forth in claim 8 wherein said second body comprises gallium arsenide phosphide.

10. A display system as set forth in claim 7 wherein said second body is selected from the group consisting of gallium phosphide, gallium nitride and gallium-aluminum-arsenide.

11. A solid state display comprising:

a. a semiconductor substrate having major surfaces on opposite sides, said substrate comprising a first body of silicon of one conductivity type and a second contiguous body of a semiconductor material of opposite conductivity type and which exhibits good light emitting characteristics, defining a hetero p-n junction in a plane of said substrate substantially parallel to said major surfaces:

b. a pocket of said opposite conductivity type extending from the exposed surface of said silicon and confined therein;

c. a relatively thin insulating layer over said silicon and pocket of opposite conductivity type defining an aperture exposing a surface region of said pocket;

d. ohmic contact means extending through said aperture and contacting said pocket for entering data in the form of minority carriers;

e. a plurality of elongated substantially parallel electrodes over said insulating layer spaced from said aperture to define a charge-coupled device shift register;

f. clocking means of one polarity for sequentially shifting said data into respective bits of said shift register;

g. means for reverse biasing said p-n junction to near avalanche breakdown; and h. bias means connected to said electrodes for selectively applying a bias of opposite polarity effective to force minority carriers toward said p-n hunction.

12. A solid state display as set forth in claim 11 wherein said substrate comprises gallium-arsenide-phosphide.

13. A solid state display as set forth in claim 11 wherein said substrate is selected from the group consisting of gallium phosphide, gallium nitride, and gallium-aluminum-arsenide.

14. A method for displaying light utilizing a semiconductor charge solid state display which includes a semiconductor substrate having a continuous p-n junction therein which is substantially parallel to the display surface of the substrate and having a semiconductor charge transfer device shift register defined adjacent the surface of the substrate opposite the display surface comprising the steps of:

shifting minority carriers corresponding to a desired image into respective bits of said shift register by sequentially applying clock pulses of one polarity to respective bits of said shift register;

b. reverse biasing said p-n junction to near avalanche breakdown; and simultaneously removing said clock pulses of one polarity and applying a voltage of opposite polarity to said shift register bits thereby avalanching said junction, forcing minority carriers into the p-n junction region where they effect emission of light upon recombining with majority carriers.

* * * * *